United States Patent [19]

Moegen et al.

[11] 4,281,260

[45] Jul. 28, 1981

[54] CONTROLLED POWER SUPPLY FOR INTEGRATED CIRCUITS

[75] Inventors: Gerhard Moegen, Neubaldham; Gottfried Wotruba, Poing, both of Fed. Rep. of Germany

[73] Assignee: Eurosil, GmbH, Munich, Fed. Rep. of Germany

[21] Appl. No.: 948,678

[22] Filed: Oct. 5, 1978

[30] Foreign Application Priority Data

Oct. 7, 1977 [DE] Fed. Rep. of Germany ..... 27453027

[51] Int. Cl.³ .......................... H03K 17/60; H03K 3/01
[52] U.S. Cl. ..................................... 307/573; 307/279; 307/296 R
[58] Field of Search ............... 307/251, 279, 296, 297, 307/362, DIG. 3

[56] References Cited

U.S. PATENT DOCUMENTS

| | | | |
|---|---|---|---|
| 4,096,402 | 6/1978 | Schroder et al. | 307/362 |
| 4,162,416 | 7/1979 | Beecham et al. | 307/362 |

*Primary Examiner*—Stanley D. Miller, Jr.
*Assistant Examiner*—B. P. Davis
*Attorney, Agent, or Firm*—Krass, Young & Schivley

[57] ABSTRACT

The present invention relates to a control circuit adapted for CMOS implementation for the control of the supply voltage for integrated circuits, and particularly, relates to the indication of and/or control of variations of a supply voltage from a predetermined value.

12 Claims, 6 Drawing Figures

CONTROLLED POWER SUPPLY FOR INTEGRATED CIRCUITS

SUMMARY OF INVENTION

Many integrated switch circuits require that the supply voltage shall not fall below or exceed a predetermined value in order to maintain a particular accuracy of operation of circuits associated therewith. Corresponding requirements exist for instance, in battery-operated clock circuits. As is well known, battery output voltage decreases with progressive discharge in all known commercial batteries. Because of the foregoing circumstances, a battery power supply is only useable up to the point that the output voltage thereof drops below some predetermined level and provision must be made for indicating this level so that the battery may be replaced. It is known from German specification DT-OS No. 25 38 406 that there may be produced an optical or acoustical signal when the battery output voltage of a battery power supply drops to or below a predetermined level. In this case, the threshold voltage is indicated by the switching point of an inverter. An exact determination of the switching point for a particular output voltage of the battery, which is reproducible in the series production of integrated circuits, presupposes, however, very low fluctuations of the parameter and cannot, at the present time, be obtained for integrated circuits. In accordance with the prior art, the exact voltage output must be adjusted by an external resistance, which, of course, requires an additional expenditure of time and material for balancing operations.

It is an object of the present invention to provide a switching arrangement for the control of a supply voltage which can be entirely integrated by CMOS techniques and which renders it possible to obtain a predetermined output voltage. The foregoing is attained by dimensioning of the integrated circuit, whereby utmost insensitivity to parameter fluctuations is achieved.

A switching arrangement, in accordance with the present invention, for the solution of the above-noted problem is achieved by the provision of two capacitors wherein the charge upon one of the capacitors depends upon a constant reference voltage, and the other is chargeable by the supply voltage. The foregoing capacitors provide control voltage for a comparison circuit, such as a bi-stable circuit which produces an output signal indicating whether a supply voltage is above or below a predetermined voltage value, as a result of the difference of the control voltages.

The present invention provides an integrated circuit which indicates the relationship of a supply voltage to a predetermined voltage value by the production of two output signals. All individual units of the switching arrangement of the present invention may be integrated, and no additional circuits for the determination of the predetermined voltage value is required. The determination in accordance with the present invention is provided automatically by the constant reference voltage which controls the charging of one of the capacitors of the circuit hereof. The other capacitor is charged to a voltage depending upon the supply voltage and a comparison circuit is connected to the two capacitors for producing signals indicating whether the supply voltage is above or below a predetermined threshold voltage. Inasmuch as this threshold is determined by the constant reference voltage, it is not influenced by variation in parameters of other integrated circuit element so that additional balancing means are not required. Various different reference voltage sources may be employed herein and formed in intergrated CMOS, as described below.

An additional advantage of the present invention is the provision of a time control wherein the two capacitors are charged during a single charging phase by the reference voltage and supply voltage, and thereafter are connected in a comparison phase to a comparison circuit. It is advantageous to charge both capacitors to equal voltages before starting the charging phase. In this situation, the two capacitors are initially charged to equal voltages so as to have corresponding output conditions prior to the control of the supply voltage. Subsequently, a transfer or shift of capacitor conditions occurs as a result of charging by a reference voltage and supply voltage with a final condition of the capacitors being employed in the comparison phase by the comparison circuit.

Advantageously, the switching arrangement in a constructed symmetrically and is then operated in such a manner that each capacitor is connected during the charging phase to voltage dividers across the supply voltage with one divider containing a reference voltage element and the other symmetrical to it, containing a resistor which produces a voltage decrease corresponding to the reference voltage at the determined voltage value of the supply voltage.

The reference voltage element employed in the present invention may be formed in a number of different ways employing integrated CMOS techniques. It is possible, for instance, to provide a reference voltage element from a $n^+p^-n^-$ transistor unit having the collector and base thereof electrically connected together. In such a unit a $p^-$ region may be formed in an $n^-$ crystalline silicon substrate by diffusion, for example. An $n^+$ region is then formed in the $p^-$ region so as to produce a structure of a type similar to that commonly known as a bipolar npn transistor. With the collector and base of the foregoing structure electrically connected, there results a current characteristic for the base-emitter diode junction which is very steep and relatively insensitive to fluctuations or variations of the process parameters. A transistor element of the foregoing type is thus advantageously employed as a reference voltage element in the present invention inasmuch as the voltage variation thereacross is substantially independent of circuit conditions which change with decreasing supply voltage.

It is possible to form reference voltage element for use in the present invention from two complementary MOS field-effect transistors which are serially connected together as diodes. An advantage of this latter arrangement is that the system may be formed as an integrated CMOS circuit on a common substrate, so that the characteristic of the reference voltage element, which is determined by the threshold voltages of the two complementary MOSfield-effect transistors, amy be employed directly as a measure of the predetermined minimum voltage value to which the supply voltage is allowed to decrease. It is known that the lowest operable value of supply voltage for CMOS circuits is determined by the sum of the threshold voltages of the complementary transistor elements. If, for example, there should occur unavoidable parameter variations in the manufacture of these CMOS circuits, they will effect the voltage threshold as determined by the reference voltage element and under this circumstance, the voltage is automatically employed in the other circuit of the integrated circuit upon a single substrate.

In certain instances the reference voltage may be formed as a resistance having a constant current passing therethrough. The necessary constant current source may be formed of integrated MOS field effect transistors which need only be connected during the control process so that only a small increase in current consumption results.

The switching arrangement of the present invention is operated in particular time sequence for attaining the above-mentioned phases of operation.

The present invention provides for the production of control signals to operate the switching arrangement hereof. Time control circuits producing control pulses are well known in the art, and may be formed in a wide variety of ways as, for example, by integrated CMOS techniques. Such circuits produce various predetermined control signals effective in chronological sequence for actuating and terminating switching operations in a controllable circuit, and reference is made to the general prior art in this respect.

DESCRIPTION OF FIGURES

The present invention is illustrated as to particular preferred embodiments thereof in the accompanying drawings wherein.

DESCRIPTION OF PREFERRED EMBODIMENTS

Figure 1:
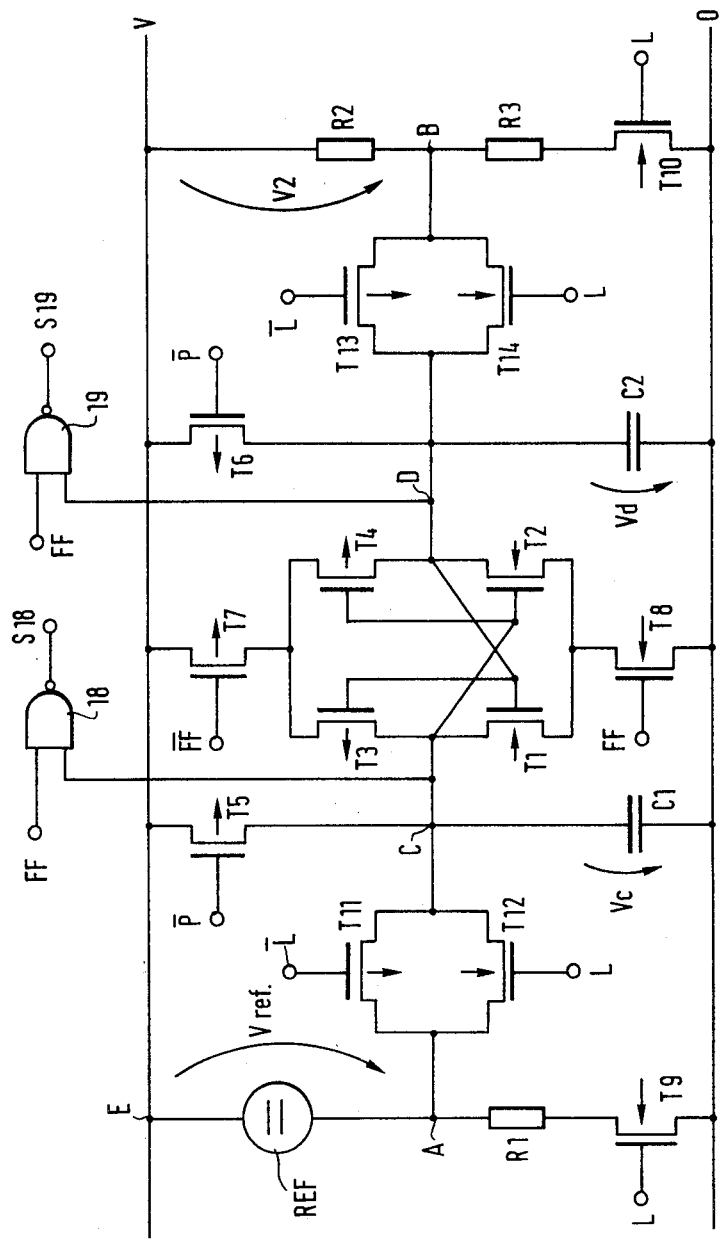
FIG. 1 is a circuit diagram of a switching arrangement for a supply voltage in accordance with the present invention.

It is first noted that the system and circuit of the present invention, as shown for example, in FIG. 1 of the drawings is readily integratable in CMOS technology for the control of a supply voltage V. The circuit of the present invention consists of several current branches connected between the supply voltage potential V and zero potential, and these circuits contain one or more MOS field-effect transistors. These transistors are controlled by control signals FF, P and L and inversions there, which are employed in particular chronological sequence, as described below.

A reference voltage element REF is shown in FIG. 1 of the drawings to be connected in series with a resistor R1 and a MOS field-effect transistor T9 across the power supply between a terminal E connected to the reference voltage source REF and a conductor connected to zero potential. Conduction of this circuit is controlled by the MOS field-effect transistor T9 in accordance with a control signal L applied to the control electrode of this transistor. A terminal A of the voltage source comprising the above-described elements is disposed between REF and R1 and, in turn, is connected through a parallel combination of two complimentary MOS field-effect transistors T11 and T12 to a terminal C. The transistors T11 and T12 are controlled as to conduction thereof by the application of control signals $\overline{L}$ and L at the control electrode of these elements. The terminal or circuit location C is connected through an MOS transistor T5 to the power supply terminal V and through a capacitor C1 to the other side of this power supply at O. The transistor T5 is controlled as to conduction thereof by the application of a control signal $\overline{P}$ to the control electrode of the transistor and a voltage Vc appears across the capacitor C1, as further described below.

The circuit of FIG. 1 includes a reference circuit in the form of a bistable circuit containing MOS field-effect transistors T1, T2, T3 and T4. These transistors are arranged in series connection in pairs of opposed type of conductivity, i.e. an N-channel transistor T1 is connected in series with P-channel transistor T3 across the series combination of an N-channel transistor T2 and a P-channel transistor T4. The gate electrodes of the transistors T2 and T4 are connected together and to the common connection of transistors T1 and T3 and to the circuit terminal C, while the gate electrodes of the transistors T1 and T3 are connected together and are connected to the common connection of transistos T2 and T4 and to a circuit terminal D. The bistable circuit comprising transistors T1 to T4 is connected through an MOS transistor T7 at the junction of transistors T3 and T4 to one side V of the power supply voltage and this bistable circuit is also connected at the junction of transistors T1 and T2 through a MOS transistor T7 to the other side O of the power supply voltage. Transistor T8 is an N-channel MOS field-effect transistor and is controlled as to conduction by a control signal FF applied to the gate thereof, while the transistor T7 is a P-channel MOS field-effect transistor, controlled as to conduction thereof by a control signal $\overline{FF}$. The circuit point or terminal D is connected through a P-channnel MOS field-effect transistor T6 to one side V of the power supply voltage and is connected through a capacitor C2 to the other side O of the power supply voltage. Conduction of the transistor T6 is controlled by application of a control signal $\overline{P}$ to the gate electrode thereof.

In addition to the foregoing connections, the circuit terminal D is connected to a tap or terminal B of a voltage divider through a parallel combination of complementary MOS field-effect transistors T13 and T14. Conduction of these transistors T13 and T14 is controlled by the application of a control signal L to the gate electrode of the N-channel transistor T14 and application of a control signal $\overline{L}$ to the gate electrode of the P-channel transistor T13. The above-noted voltage divider is comprised of a resistor R2 connected between one terminal V of the power supply voltage and terminal B, and a resistor R3 connected from a terminal B through an N-channel MOS field-effect transistor T10 to the other side O of the power supply voltage. Conduction of this transistor T10 is controlled by the application of a control signal L to the gate electrode thereof.

The two terminals C and D form the control inputs for the bistable circuit comprising the transistors T1 to T4, and it is noted that this may comprise a conventional bistable circuit. The signals produced by the two different circuit conditions of this bistable circuit appear at the terminals C and D and is shown to be connected to inputs of NAND circuits 18 and 19, respectively. The other inputs of these NAND circuits comprise control signals FF. Output signals S18 and S19 from the NAND circuits 18 and 19, respectively, are indicative of the amplitude of the supply voltage V relative to a predetermined minimum voltage, as described below.

The circuit of FIG. 1 is constructed entirely symmetrically. The MOS field-effect transistors, T1, T2, T8, T9, T10, T12 and T14 are of the N-channel type for the transistors T3, T4, T5, T6, T7, T11 and T13 are of the P-channel type. The substrate connection of the N-channel transistors may be connected to zero potential and the substrate connections of the P-channel transistors may be connected to the supply voltage potential V. It is also possible to provide other substrate connections as is known to those skilled in the art.

The transistors T11 and T13 or the transistors T12 and T14 are to be connected in accordance with the parameters of the circuit. If predetermined minimum voltage to which the supply voltage V is allowed to decrease is within the range of the total of the threshold voltages of the P and N-channel transistors, the transistors T11, T13 or T12, T14 should not be removed. The reason for the foregoing is that in general, the total of the threshold voltages of the P and N-channel transistors in CMOS varies only slightly, while the threshold voltages of ordinary transistors may fluctuate considerably. In FIG. 1, there is shown for example, an advantageous arrangement wherein high P-channel threshold voltage and low N-channel threshold voltage may cause the transistors T11 and T13 to be blocked by the control signal $\overline{L}$, while the transistors T12 and T14 are conducting because of the control signal L, so that there is ensured a completion of the connection between points A and C, and points B and D, irrespective of fluctuations of individual threshold voltages.

The bistable circuit including transistors T1 to T4 is connected across the supply voltage by the transistors T7 and T8 in the circuit of FIG. 1. It is noted, however, that the transistor T7 may be replaced by a direct connection in most instances inasmuch as the bistable circuit would normally be disconnected from the power supply by operation of the transistor T8 alone.

It is also noted that the circuit of FIG. 1 may be constructed in metal gate technology, as well as silicon gate CMOS technology. The ohmic resistances in the circuit may be formed in a known manner by a $n^+$, $p^-$, or $p^+$ diffused regions in a substrate.

Figure 2:
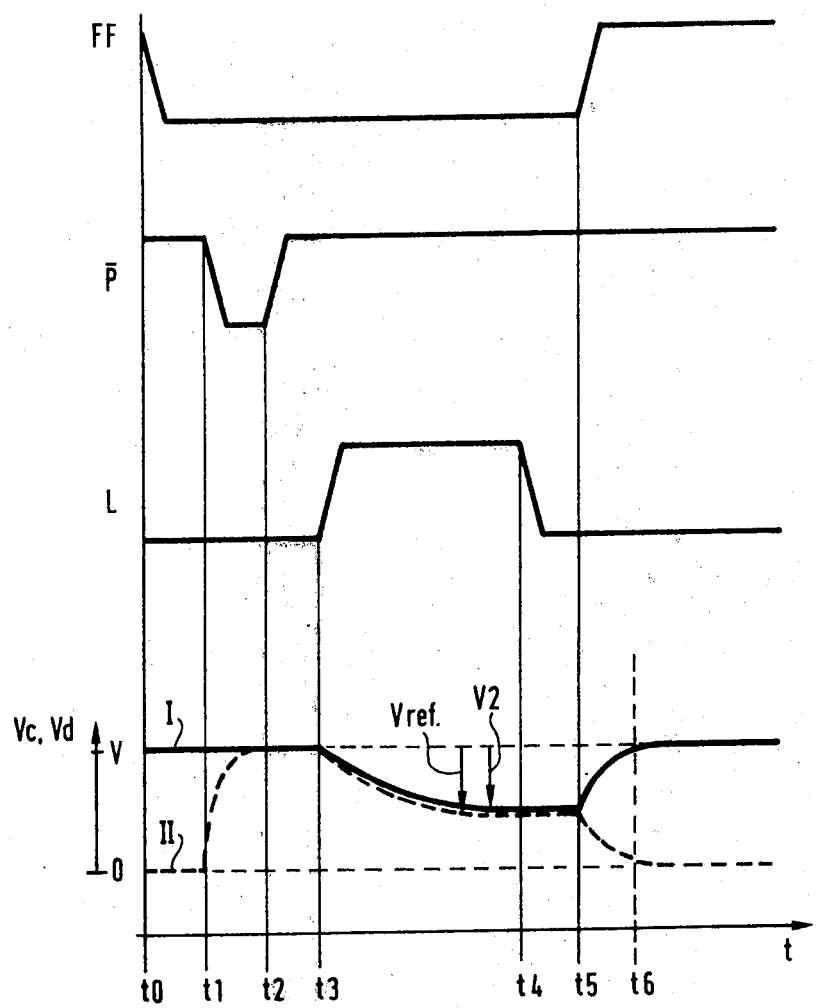
FIG. 2 is a diagram illustrating the relationship of control signals and charge conditions of the capacitors of the present invention.

The method of operation of the circuit of FIG. 1 is best understood by reference to the graph of FIG. 2, illustrating the time relationship of the control signals to the charging conditions of the capacitor C1 and C2. The control signals FF, P, and L, as well as the inverse of these signals are supplied by a suitable control circuit not herein described inasmuch as the generation of control signals of this sort is well known in the art.

In FIG. 2, the voltages I and II represent the momentary charging condition of the capacitors C1 and C2. The voltage on the capacitors depends upon the amplitude of the controlling supply voltage and the voltage on capacitors C1 may, for example, be as shown by the solid line I on FIG. 2, and the voltage on capacitors C2 be as shown by the dotted line II in FIG. 2. The voltages $V_c V_d$ appear across the capacitors C1 and C2, respectively, and these capacitors are initially charged during the period t1 to the operating voltage V. Subsequently, during the period t3 to t4, the voltage values on these capacitors changes to V−Vref on capacitor C2 and to V−V2 on capacitor C1. The foregoing are the voltages which appear at the terminals A and B of the circuit of FIG. 1. During the period t5 to t6 of FIG. 2, the capacitor voltages $V_c V_d$ are applied to the control inputs to the bistable circuit of transistors T1 to T4 of FIG. 1 whereby the charge on these capacitors changes, as later described so as to produce particular potentials at the circuit terminals C and D for operating the output circuits 18 and 19.

During the time period t1, the control signal FF is applied to the circuit of FIG. 1 for blocking the conduction of transistor T8 and thus disconnecting the bistable circuit from across the power supply. Simultaneously, the transistor T7 is blocked by a control signal $\overline{FF}$ which will be noted to merely comprise the inversion of the control signal FF. Thus it will be seen that the comparison circuit of the bistable connection of transistors T1 to T4 is disconnected from the power supply for the duration of the control signal FF, i.e., until the time t5.

At the time t1 a control signal P is applied to transistors T5 and T6 so that these transistors conduct. At this time then the capacitors C1 and C2 are connected to the operating voltage V so that both of these capacitors are charged to this potential V. In FIG. 2, it is shown that one of the capacitors is already charged to the voltage V as a result of a previous switching operation and consequently, only the other capacitor is charged in accordance with the curve II to the operating voltage V. This charging takes place during the period t1 to t2, i.e. the duration of the control signal $\overline{P}$. At the time t2 the control signal $\overline{P}$ is terminated so that the transistors T5 and T6 are rendered non-conducting. At the time t3 the control signal L is applied to the circuit for causing transistors T9 and T10 to conduct and connect the voltage dividers at opposite ends of the circuit of FIG. 1 across the power supply potential. Additionally, the circuit points A and C are connected together and the circuit points B and D are connected together so that the potentials appearing at the circuit points A and B as compared to zero potential cause a change in the charge upon capacitors C1 and C2 and thus on the voltages $V_c$ and $V_d$. The first voltage $V_c$ appearing on capacitor C1 depends upon the voltage Vref of the reference voltage source REF and the voltage $V_d$ appearing on capacitor C2 depends upon the voltage V2 across the resistor R2 of the voltage divider shown at the right of FIG. 1. Depending upon the amplitude of the operating v dtage V, it will be seen that the voltage V−V2 will be above or below the voltage V−Vref. In the illustration of FIG. 2, the voltage V−V2 is shown to be above the voltage V−Vref. The voltage V−Vref shown by the dotted lines in FIG. 2 in the periods t3 to t4 is considered to be the predetermined minimum voltage value representing the threshold of operation and when this voltage falls below the threshold, the current source which supplies the supply voltage V should be replaced.

It will be appreciated that owing to the difference of the two charging voltages $V_c V_d$ of the two capacitors, C1 and C2, there is produced a potential difference at the control inputs of the bistable circuit formed of transistors T1 to T4 at the circuit points B and D.

At the time t4 the control signal L, and the inversion L is terminated so that the circuit points A and C are disconnected and the circuit points B and D are disconnected. The capacitors C1 and C2 retain the respective charging voltages $V_c$ and $V_d$ attained during the charging period t3 to t4.

At the time t5 the control signal FF and the inversion $\overline{FF}$ thereof is terminated so that at this time the bistable circuit of transistors T1 to T4 is connected across the supply voltage through the transistors T7 and T8. Depending upon the potential difference between the circuit points C and D of FIG. 1 as produced by the described charging of the capacitors C1, C2, the bistable circuit will operate in one of two possible manners, i.e., either the transistors T1 and T4 will conduct, or the transistors T2 and T3 will conduct. Under the condition of the transistor T1 conducting, the capacitor C1 will be discharged through the transistors T1 and T8, and the capacitor C2 will be charged to operating voltage V through T4 and T7. If, on the other hand, the transistor T2 is conductive, the capacitor C2 will be discharged through the transistors T2 and T8 and capacitor C1 charged to V through transistors T3 and T7. This condition is represented in FIG. 2 as occurring during the period t5 to t6. In accordance with the illustration of FIG. 2 the voltage curve II represents a discharge to zero potential and the voltage curve I represents a charging to the supply voltage potential V. The foregoing occurs by virtue of the fact that the bistable circuit operates to cause conduction of the transistors t1 and t4 or conduction of the transistors t2 and t3 because of their placement in the circuit. Consequently, one capacitor, such as the capacitor C1 is discharged through the transistors T1 and T8, while the other capacitor C2 is charged to the operating voltage potential V through the transistors T4 and T7. Thus, in FIG. 2, the curve I relates to the charge on capacitor C2 with the dotted curve II representing the charge on capacitor C1. In the foregoing situation, the voltage $V_d$ is higher than the voltage $V_c$. It will, of course, be noted that the reverse of the foregoing is possible wherein the voltage $V_c$ is higher or greater than the voltage $V_d$ wherein the recharging curve I of FIG. 2 would be lower than the dotted curve II.

It will be seen from the foregoing that the switching operation of the bistable circuit of transistors T1 to T4 of the present invention, there occurs different potentials at the circuit points at terminals C and D with the amplitude thereof being established by the supply voltage V. These potentials are applied to the first inputs of the NAND circuits 18 and 19 which have the control signal FF applied to the second inputs thereof. This control signal FF terminates at the time t5 so that the output signals S18 and S19 of the NAND circuits comprise logical signals 1 and 0 or 0 and 1 as a positive identification of the supply voltage being above or below the predetermined voltage value which comprises the switching threshold of the circuit.

In the circuit of FIG. 1, it is theoretically possible for the capacitors C1 and C2 to be recharged to identical potentials, however, in practical applications to the present invention, the voltages $V_c$ and $V_d$ are always different.

The predetermined minimum voltage value $V_s$ with which the supply voltage is compared to determine whether or not the latter is above or below the minimum limit is related to the value of the resistors R2 and R3 of the voltage divider at the right of FIG. 1 by relationship.

$$V_s = V_{ref}(R_2 + R_3)/R_2$$

It is advantageous in construction of the present invention to form the two resistors R1 and R3 of the two voltage dividers with corresponding resistance values and the two voltage dividers should have like impedance, so that the described recharging of the two capacitors C1 and C2 takes place with corresponding time constants. Asymmetrical or unequal time constants may cause such a short time period t3 to t4 that a false result is obtained.

In order to guarantee a symmetrical capacity load of the two circuit points C and D, the output stages shown in FIG. 1 as NAND circuits 18 and 19 should also be identical. The use of these NAND output circuits 18 and 19 is advantageous in preventing current flow in the time interval t1 to t5.

Figure 3:
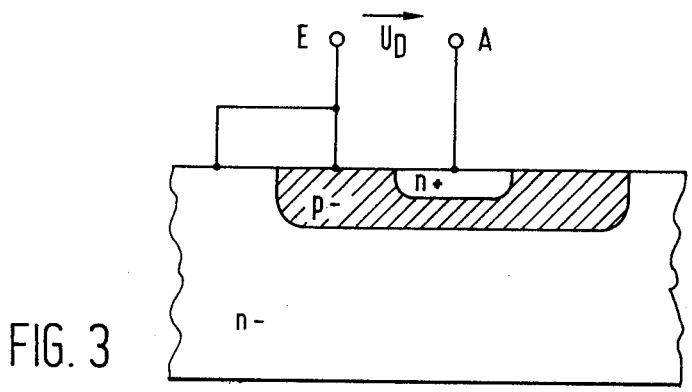
FIG. 3 is a sectional view of a semi-conductor element that may be employed as a reference voltage element in the circuit of FIG. 1.

Reference is now made to FIG. 3 of the drawings illustrating a part of a CMOS structure in cross section which comprises a transistor element that may be employed as the reference voltage element REF in the circuit of FIG. 1 between the points A and E thereof. In accordance with semiconductor processing, a $p^-$ region is formed in an $n^-$ substrate of crystalline silicon as, for example, by diffusion processing. This $p^-$ region is shown in FIG. 3 by cross section. Into the upper surface of the $p^-$ region there is formed an $n^+$ region, so as to produce a structure similar to that of a bipolar npn transistor which may be considered as an $n^+p^-n^-$ transistor. Electrical connection of the collector and base of the foregoing structure, i.e., connection of the $n^-$ and $p^-$ regions externally to one another as shown in FIG. 3 will cause the device to comprise a diode by virtue of the operative semiconductor junction between the $n^+$ emitter and $p^-$ base of the structure.

Figure 4:
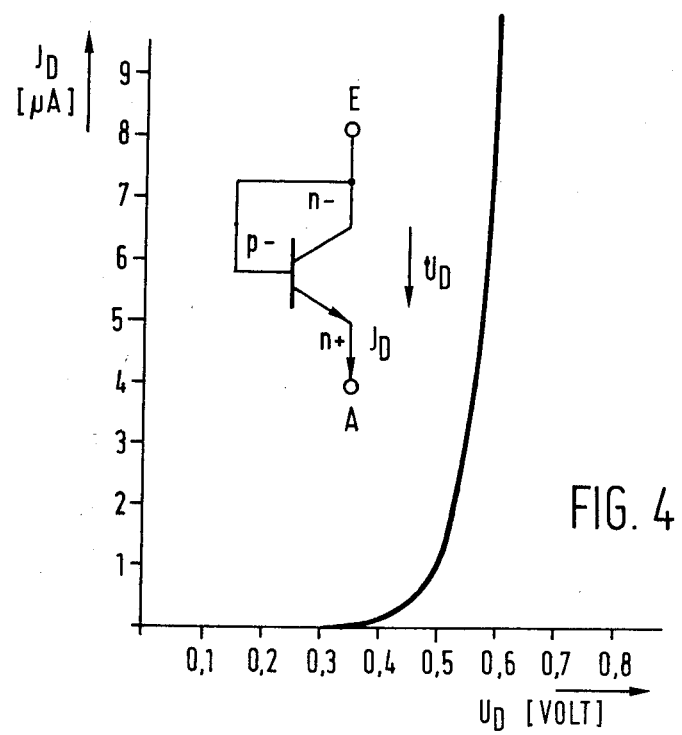
FIG. 4 is a graph of the current voltage characteristic of the element of FIG. 3 and also including an electrical representation of the connections of the element of FIG. 3.

Referring to FIG. 4, there will be seen to be shown a graph of the conducting characteristic of the structure of FIG. 3, as well as an electrical diagram of the structure. The curve of FIG. 4 illustrates the dependence of the diode current $J_D$ upon the voltage $U_D$ across the diode of the device. This characteristic is obviously quite abrupt and is relatively insensitive to variations of the process parameters during construction of the element of FIG. 3. Consequently, the element of FIG. 3 may be advantageously employed as the reference voltage element REF of FIG. 1. In one example of the present invention, a current change from about 1.5 $\mu A$ to 8 $\mu A$ will produce a voltage change in $U_D$ of only about 0.1 volt. Because of the steep curve of FIG. 4, it will be seen that only a small change in the voltage Vref will take place at the start of conduction of the element of FIG. 3 because of variations in the resistance of the resistor R1 which may be formed by integrated circuit techniques, for example, and may, in fact, be fairly substantial, as of the order of 30% to 100%. This change of the voltage Vref is so small that the element of FIG. 3 is particularly adapted for use as the reference voltage element in the present invention.

Figure 5:
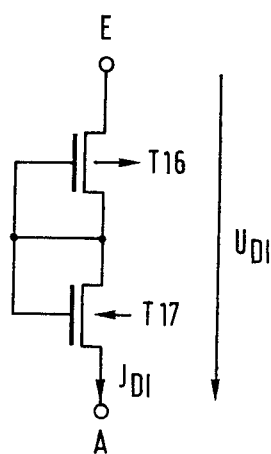
FIG. 5 is an electrical diagram of a CMOS voltage reference unit, as may be employed in the circuit of FIG. 1.
Figure 6:
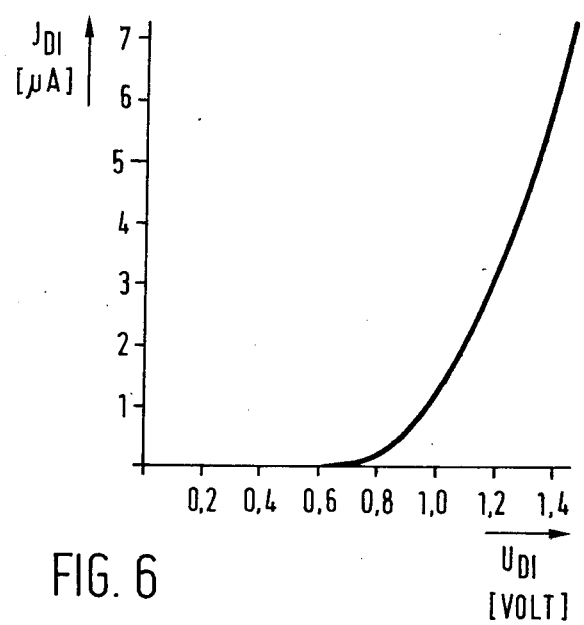
FIG. 6 is a graph of the current voltage characteristic of the reference voltage element of FIG. 5.

Another type of reference voltage element that may be advantageously employed in the present invention is illustrated in FIG. 5. This element comprises two complimentary MOS field-effect transistors T16 and T17 connected in series with the gate electrodes thereof connected together and connected to the common source drain connection of the transistors so as to produce two MOS diodes. The circuit or element of FIG. 5 may be employed between the points A and E of the circuit of FIG. 1 with the advantage that integration of the double diode on the same circuit base with the circuit charged by the supply voltage V allows the total of the transistor threshold voltage is to be used as a measure of the minimum or threshold voltage which is to be indicated as exceeding or falling below some predetermined value by the supply voltage V. The series connection in FIg. 5 has a current characteristic, as shown in FIG. 6. The illustration of FIG. 6 shows the dependence of the current $J_{DI}$ which passes through the series connection on the voltage $U_{DI}$ across the connection. The location of the current characteristic of FIG. 6 is predetermined by the total of the transistor threshold voltages of the two transistors T16 and T17. Inasmuch as the total of the two threshold voltages of the integrated CMOS circuits represents the voltage value which is not to be greater than the supply voltage V, the location of the curve of FIG. 6 may be employed as a measure of the predetermined minimum voltage of the supply voltage.

It is also noted that the reference voltage source employed in the circuit of FIG. 1 may be implemented as a resistor having a constant current passed therethrough. This possible construction is not herein illustrated or further described. It is, however, noted in comparison with the above-described possible forms of construction of reference voltage sources wherein the characteristic is relatively steep and provides only a relatively small voltage range for threshold voltages, this latter alternative offers the capability of predetermining the value of the reference voltage Vref to be employed in the circuit. This can be accomplished either by appropriate dimensioning of the resistor value or controlling the constant supply by the constant current source. The constant current source may be connected in such a manner that it is, in fact, operative only during the time of existence of the control signal L of FIG. 2, i.e., for the time period between t3 and t4, so as to minimize current consumption.

Although the present invention has been described above with respect to particular preferred embodiments thereof, it will be apparent to those skilled in the art that numerous modifications and variations are possible within the scope of the present invention, and thus it is not intended to limit the invention to the precise of terms of description or details of illustration.

What is claimed is:

1. A circuit that may be formed in integrated CMOS for the control of a supply voltage for integrated circuits by indication of the relation of the supply voltage to a predetermined voltage value characterized by
   first and second capacitors,
   a constant reference voltage source adapted for connection to charge one of said capacitors and means connecting a supply voltage to charge the other of said capacitors,
   a bistable comparison circuit having first and second complementally conductive stages, triggering inputs for said stages and signal outputs from said stages, said first and second capacitors being connected to said triggering inputs to control the order of complemental conductivity of said stages according to the relative voltage values on said capacitors;
   logic means connected to respective outputs of the bistable comparison circuit for producing a digital signal the value of which indicates the order of complemental conductivity of said bistable comparison circuit; and
   means for simultaneously actuating the comparison circuit and the logic means subsequent to the charging of said capacitors.

2. The circuit of claim 1 further characterized by timed control means providing timed control signals for charging said capacitors in a charging phase of operation and connecting the charged capacitors to said comparison circuit during a comparison phase of operation.

3. The circuit of claim 2 further characterized by means charging said capacitors to the same voltage prior to initiation of said charging phase.

4. The circuit of claim 2 further characterized by first and second voltage dividers connected across said power supply voltage, the first of said voltage dividers including a reference voltage element and the second of said voltage dividers including a resistor which produces a voltage thereacross corresponding to the voltage of said reference voltage element at a predetermined voltage value of said supply voltage.

5. The circuit of claim 2 further characterized by means connecting each of said capacitors to said supply voltage immediately prior to initiation of said charging phase.

6. The circuit of claim 4 wherein said reference voltage element comprises a $n^+p^-n^-$ transistor element having the collector and base thereof electrically connected.

7. The circuit of claim 4 further characterized by said reference voltage element comprising a pair of MOS field-effect transistors connected in series with the gate of each of said transistors being electrically connected to the junction of the transistors.

8. The circuit of claim 4 further characterized by said reference voltage source comprising a resistor having a constant current source connected thereacross.

9. The circuit of claim 1 further characterized by switching means connecting said bistable circuit across said power supply and having control means therefor connected to first and second circuit terminals, in turn, connected through said first and second capacitors to one side of said power supply with means connecting said bistable circuit across said power supply during said comparison phase of the circuit.

10. The circuit, as defined in claim 9 wherein said logic means comprises a pair of NAND circuits connected one to each of said circuit terminals and each having an additional terminal connected to receive a control signal for conduction of each NAND circuit only after recharging of said capacitors.

11. The circuit according to claim 4 further characterized by additional switching means connected between said circuit terminals and mid-points of said voltage dividers together with means applying control voltage of said further switching circuits for activating the latter only during the charging phase of the defined circuit.

12. A circuit for indicating the relationship of the voltage of a power supply for an integrated circuit in relation to a predetermined voltage value comprising
   a first voltage divider connected to said power supply and comprising a voltage reference source connected in series with a resistor and a first switch across said power supply,
   a second voltage divider comprising first and second resistors connected in series with a second switch across said power supply, a bistable comparison circuit having control means connected in series with switching means across said power supply, first and second capacitors connected in series with third and fourth switches, respectively, across said power supply and each having circuit terminals at the connection of switches and capacitors, separate switching means connecting the mid-point of said voltage dividers to said circuit terminals, means controlling said switching means for connecting the mid-points of said voltage dividers to said circuit terminals and for connecting said bistable circuit across said power supply for operating said bistable circuit, and output means for producing signals responsive to the relative potentials of said circuit terminals indicative of the relationship between a voltage proportional to the voltage of said power supply and the voltage of said voltage reference source.

* * * * *